United States Patent [19]

Kiyama et al.

[11] Patent Number: 5,064,682
[45] Date of Patent: Nov. 12, 1991

[54] METHOD OF FORMING A PSEUDO-DIAMOND FILM ON A BASE BODY

[75] Inventors: Seiichi Kiyama, Takatsuki; Hitoshi Hirano, Nishinomiya, both of Japan

[73] Assignee: Sanyo Electric Co., Ltd., Osaka, Japan

[21] Appl. No.: 601,627

[22] Filed: Oct. 23, 1990

[30] Foreign Application Priority Data

Oct. 26, 1989 [JP] Japan .................................. 1-280251
Oct. 26, 1989 [JP] Japan .................................. 1-280252

[51] Int. Cl.⁵ .............................................. B05D 3/06
[52] U.S. Cl. .................................. 427/38; 204/192.1;
427/249; 427/255.1; 427/322; 427/327
[58] Field of Search ................. 427/38, 322, 327, 249, 427/255.1; 204/192.1

[56] References Cited

FOREIGN PATENT DOCUMENTS 61-52887 3/1986 Japan .

*Primary Examiner*—Bernard Pianalto
*Attorney, Agent, or Firm*—Armstrong, Nikaido, Marmelstein, Kubovcik & Murray

[57] ABSTRACT

A method of forming a pseudo-diamond film on a base body, the method comprising a first step of irradiating carbon ions onto a surface of a base body from an assisting ion gun to form a mixture layer comprising base body material atoms and carbon atoms; a second step of simultaneously vapor-depositing the carbon atoms from a vapor deposition source and irradiating hydrogen ions from the assisting ion gun onto the mixture layer to form pseudo-diamond cores on the mixtures layer; and a third step of vapor-depositing carbon atoms from the vapor deposition source and irradiating hydrogen ions from the assisting ion gun onto the pseudo-diamond cores to form a pseudo-diamond film on the pseudo-diamond cores.

16 Claims, 4 Drawing Sheets

METHOD OF FORMING A PSEUDO-DIAMOND FILM ON A BASE BODY

BACKGROUND OF THE INVENTION (1) Field of the Invention

This invention relates to a method of forming a pseudo-diamond film on a surface of a blade of a cutting tool or a semiconductor material in order to improve characteristics of the blade or to protect the surface of the semiconductor material.

(2) Description of the Prior Art

Blades of an electric razor is generally produced by pressing or electrocasting steels or nickel alloys. Usually, an electric razor has a fixed blade and movable blades. The two types of blades contact each other on their cutting surfaces and both contact are worn and get less sharp due to the friction.

Recently proposed to overcome this problem is coating a pseudo-diamond film on blades of the synthetic resin or stainless steel by ion-plating (Japanese Patent Publication Laid-Open Nos. 61-52887 and 61-52888). Such method involves the problem of weak adhesion of the film and the blades, which are made of different materials.

SUMMARY OF THE INVENTION

Accordingly, this invention has an object of offering a method of forming a pseudo-diamond film on a base body with stronger adhesion so as to enhance both the hardness and the durability of a surface of the base body.

The above object is fulfilled by a method of forming a pseudo-diamond film on a base body, the method comprising a first step of irradiating carbon ions onto a surface of a base body from an assisting ion gun to form a mixture layer comprising base body material atoms and carbon atoms; a second step of simultaneously vapor-depositing the carbon atoms from a vapor deposition source and irradiating hydrogen ions from the assisting ion gun onto the mixture layer to form pseudo-diamond cores on the mixture layer; and a third step of vapor-depositing carbon atoms from the vapor deposition source and irradiating hydrogen ions from the assisting ion gun onto the pseudo-diamond cores to form a pseudo-diamond film on the pseudo-diamond cores.

The base body may be formed of a material selected from the group consisting of stainless steel, carbon steel, electrocasted nickel, copper, copper alloys, ceramics, aluminum, aluminum alloys, magnesium, magnesium alloys and reinforced plastics.

The carbon ions may be irradiated with an acceleration voltage which is high enough to allow the carbon ions to roughen the surface of the base body when the carbon ions bump into the surface but low enough to prevent the carbon ions from going deep inside the base body without roughening the surface.

An acceleration voltage for and a current density generated by the hydrogen ions in the second step may be high enough to form the pseudo-diamond cores on the surface of the base body without graphitizing the pseudo-diamond cores.

An acceleration voltage for and a current density generated by the hydrogen ions in the third step may be lower than those in the second step.

The above object is also fulfilled by a method of forming a pseudo-diamond film on a base body, the method comprising a first step of irradiating carbon ions in an excessive amount onto a surface of a base body from an assisting ion gun to form a mixture layer comprising base body material atoms and a portion of the carbon ions; a second step of irradiating hydrogen ions from the assisting ion gun onto the mixture layer to form pseudo-diamond cores comprising the remaining portion of the carbon ions on the mixture layer; and a third step of vapor-depositing carbon atoms from the vapor deposition source and irradiating hydrogen ions from the assisting ion gun onto the pseudo-diamond cores to form a pseudo-diamond film on the pseudo-diamond cores.

The above object is also fulfilled by a method of forming a pseudo-diamond film on a base body, the method comprising a first step of irradiating carbon ions onto a surface of a base body to form a mixture layer comprising base body material atoms and carbon atoms; a second step of roughening a surface of the mixture layer by sputtering; a third step of irradiating hydrogen ions and either one of carbon atoms and carbon ions onto the mixture layer to form pseudo-diamond cores on the mixture layer; and a fourth step of irradiating hydrogen ions and carbon atoms onto the pseudo-diamond cores to form a pseudo-diamond film on the pseudo-diamond cores.

An acceleration voltage for and a current density generated by the hydrogen ions in the third step may be high enough to form the pseudo-diamond film on the surface of the base body without graphitizing the pseudo-diamond cores.

An acceleration voltage for and a current density generated by the hydrogen ions in the fourth step may be lower than those in the third step.

The above object is also fulfilled by a method of forming a pseudo-diamond film using a vacuum deposition and ion irradiation apparatus including a rotatable base body holder, a vapor deposition source and an assisting ion gun in a chamber, the method comprising a first step of irradiating carbon ions onto a surface of a base body from an assisting ion gun to form a mixture layer comprising base body material atoms and carbon atoms while rotating a base body holder; a second step of simultaneously vapor-depositing the carbon atoms from a vapor deposition source and irradiating hydrogen ions from the assisting ion gun onto the mixture layer while rotating the base body holder to form pseudo-diamond cores on the mixture layer; and a third step of vapor-depositing carbon atoms from the vapor deposition source and irradiating hydrogen ions from the assisting ion gun onto the pseudo-diamond cores while rotating the base body holder to form a pseudo-diamond film on the pseudo-diamond cores.

The above object is also fulfilled by a method of forming a pseudo-diamond film using a vacuum deposition and ion irradiation apparatus including a rotatable base body holder, a vapor deposition source, a first assisting ion gun for high energy acceleration and a second assisting ion gun for low energy acceleration in a chamber, the method comprising a first step of irradiating carbon ions onto a surface of a base body from a first assisting ion gun to form a mixture layer comprising base body material atoms and carbon atoms; a second step of irradiating inert gas ions such as argon ions from a second assisting ion gun onto the mixture layer to roughen a surface of the mixture layer; a third step of simultaneously irradiating carbon ions from the first assisting ion gun and irradiating a mixture of hydrogen ions and inert gas ions such as argon ions from the second assisting ion gun onto the mixture layer to form pseudo-diamond cores on the mixture layer; and a fourth step of simultaneously driving a vapor deposition source to vapor-deposit carbon atoms and irradiating hydrogen ions and inert gas ions such as argon ions from the second assisting ion gun onto the pseudo-diamond cores to form a pseudo-diamond film on the pseudo-diamond cores.

According to the above, a mixture layer is first formed on a base body, and then a pseudo-diamond film is formed on the mixture layer. Since the mixture layer has components both of the film and the base body, the film is adhered on the base body strongly. This strong adhesion greatly improves tenacity and hardness of the base body.

Also according to the above, after the mixture layer is formed, pseudo-diamond cores are formed, which is prevented from graphitizing by use of hydrogen ions. Since the pseudo-diamond film is formed on such pseudo-diamond cores, the film can be formed stably with no possibility of graphitizing.

BRIEF DESCRIPTION OF THE DRAWINGS

These and other objects, advantages and features of the invention will become apparent form the following description thereof taken in conjunction with the accompanying drawings which illustrate specific embodiments of the invention. In the drawings.

DESCRIPTION OF THE PREFERRED EMBODIMENTS

Figure 1:
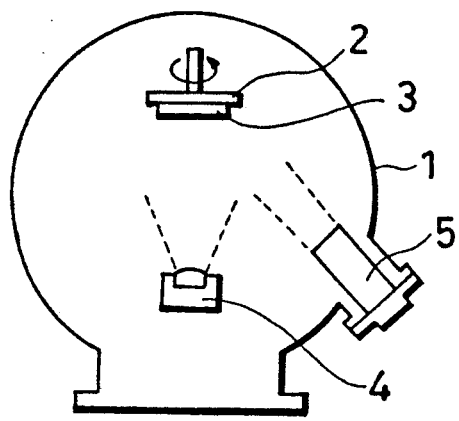
FIG. 1 is a schematic plan view of an apparatus for forming a pseudo-diamond film by a method according to this invention.

FIG. 1 shows a vacuum deposition and ion irradiation apparatus used for a method according to this invention. 1 refers to a chamber whose air pressure is to be reduced to $10^{-5}$ to $10^{-7}$ torr, 2 to an edge base holder provided in the chamber 1 and rotatable in the direction of the arrow at a speed of 10 to 20 rpm, and 3 to an edge base, as a base body, formed either of stainless steel, carbon steel, electrocasted nickel, copper, copper alloys, ceramics, aluminum, aluminum alloys, magnesium, magnesium alloys or reinforced plastics. 4 is a vapor deposition source for vapor-depositing carbon atoms toward the edge base 3, and 5 is an assisting ion gun for irradiating ions toward the edge base 3 as well as for accelerating the carbon atoms vapor-deposited from the vapor deposition source 4.

Figure 2:
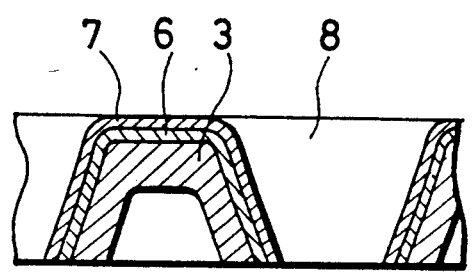
FIG. 2 is a cross sectional view of an essential part of an external blade of an reciprocating electric razor which is realized by the apparatus of FIG. 1.

An external blade of an electric razor realized by this apparatus has a construction as shown in FIG. 2. A pseudo-diamond film 7 is provided on the edge base 3 with a mixture layer 6 therebetween, the mixture layer 6 being formed of the carbon atoms constituting the pseudo-diamond film 7 and edge base material atoms. 8 refers to a hole into which beard or moustache is to be inserted.

Figure 3A:
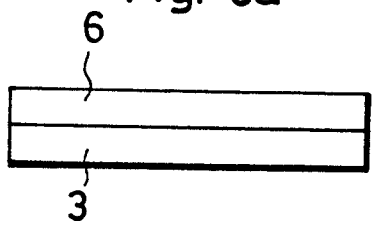
FIGS. 3a through 3c show steps of forming a pseudo-diamond film by the apparatus of FIG. 1.

The mixture layer 6 is produced in the following way. The air pressure of the chamber 1 is reduced to $10^{-5}$ to $10^{-7}$ torr. The assisting ion gun 5 is driven and supplied with CH$_4$ (methane), thereby carbon ions are irradiated from the assisting ion gun 5 onto a surface of the edge base 3. In this way, the mixture layer 6 having a thickness of, for example, 0.1 μm is formed on the surface of the edge base 3 (FIG. 3a). The amount of and the acceleration voltage for the carbon ions are determined so that they should be optimum for forming pseudo-diamond cores 9 (FIG. 3b) on the mixture layer 6 easily and for adhering the pseudo-diamond film 7 on the edge base 3 strongly enough.

Figure 4:
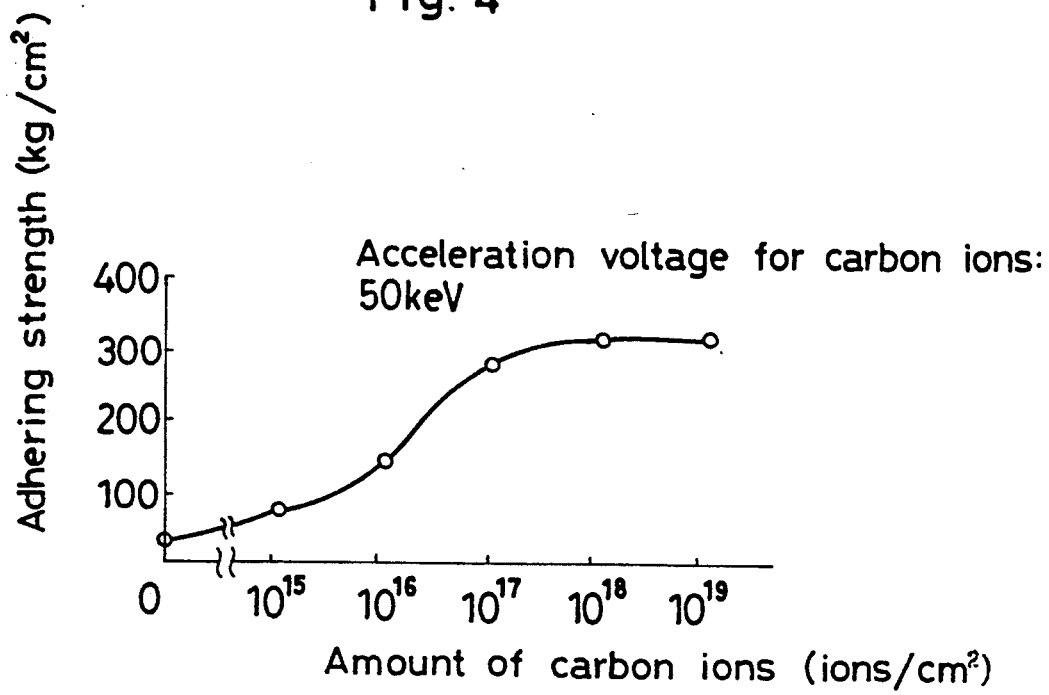
FIG. 4 shows the relationship between the amount of carbon ions and the adhering strength of the pseudo-diamond film on a base body.

FIG. 4 shows the relationship, obtained from an experiment, between the amount of the carbon ions and the adhering strength of the pseudo-diamond film 7 on the edge base 3. The edge base 3 was formed of stainless steel and the acceleration voltage was 50keV. The amount of the carbon ions was measured based on the density of the current supplied from the assisting ion gun 5, and the adhering strength was measured by peeling the film 7 off the edge base 3 by use of a peeling-off device. It is concluded from the result that the optimum amount of the carbon ions is $10^{17}$ to $10^{19}$ (ions/cm$^2$).

Figure 5:
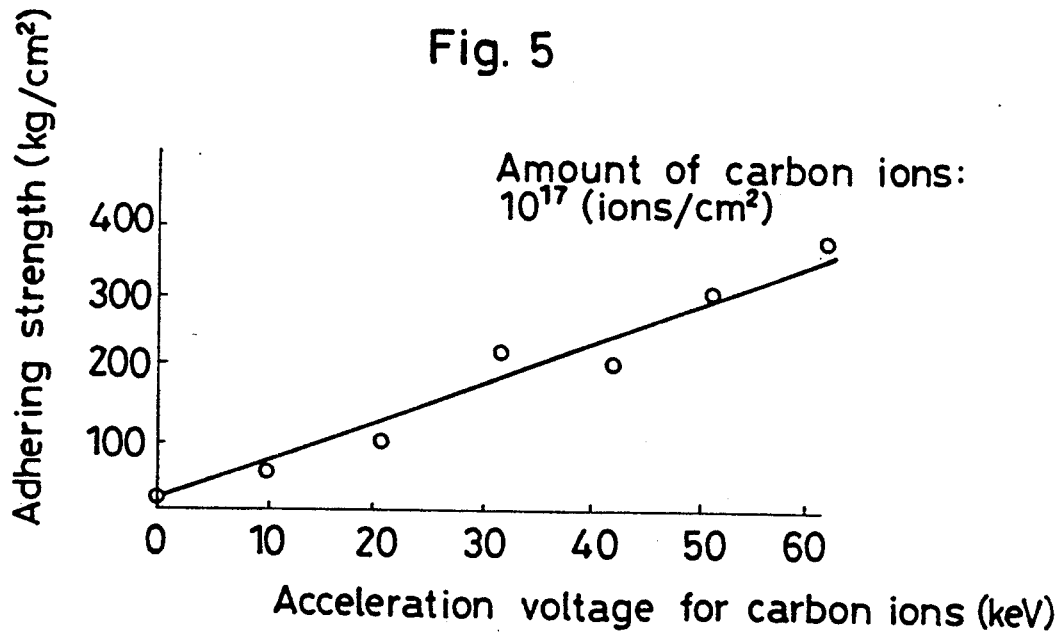
FIG. 5 shows the relationship between the acceleration voltage for the carbon ions and the adhering strength.

FIG. 5 shows the relationship, also obtained from an experiment, between the acceleration voltage and the adhering strength. The amount of the carbon ions was $10^{17}$ (ions/cm$^2$). As apparent from this graph, the higher the acceleration voltage is, the larger the adhering strength is. However, if the acceleration voltage is too high, the carbon ions go deep inside the edge base 3 without roughening the surface of the edge base 3. Since easy formation of the pseudo-diamond cores 9 requires the surface of the edge base 3 to be rough, the acceleration voltage should be low enough for the ions to roughen the surface of the edge base 3. Considering these facts, the optimum acceleration voltage is 1 to 100keV when stainless steel is used for the edge base 3.

If the edge base 3 is formed of a different material, the optimum amount of and acceleration voltage for the carbon ions are as shown in Table 1.

TABLE 1

| Edge base | Amount of carbon ions (ions/cm$^2$) | Acceleration voltage (keV) |
|---|---|---|
| Electocasted nickel | $10^{17}$ to $10^{19}$ | 1 to 30 |
| Copper | $10^{17}$ to $10^{19}$ | 1 to 60 |

The pseudo-diamond cores 9 are formed on the mixture layer 6 in the following way.

Figure 3B:
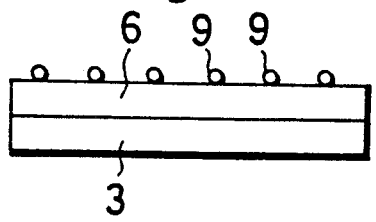
Figure 6:
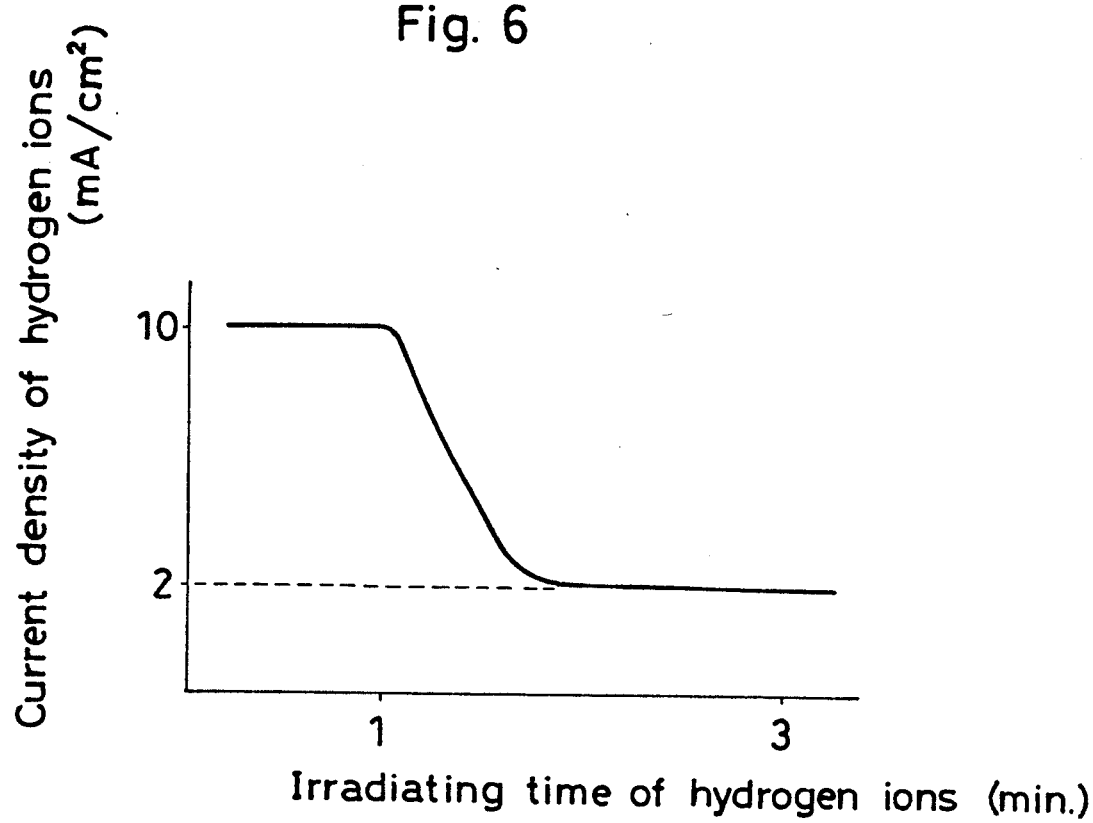
FIG. 6 shows the relationship between the current density generated by and the irradiating time of hydrogen ions.
Figure 7:
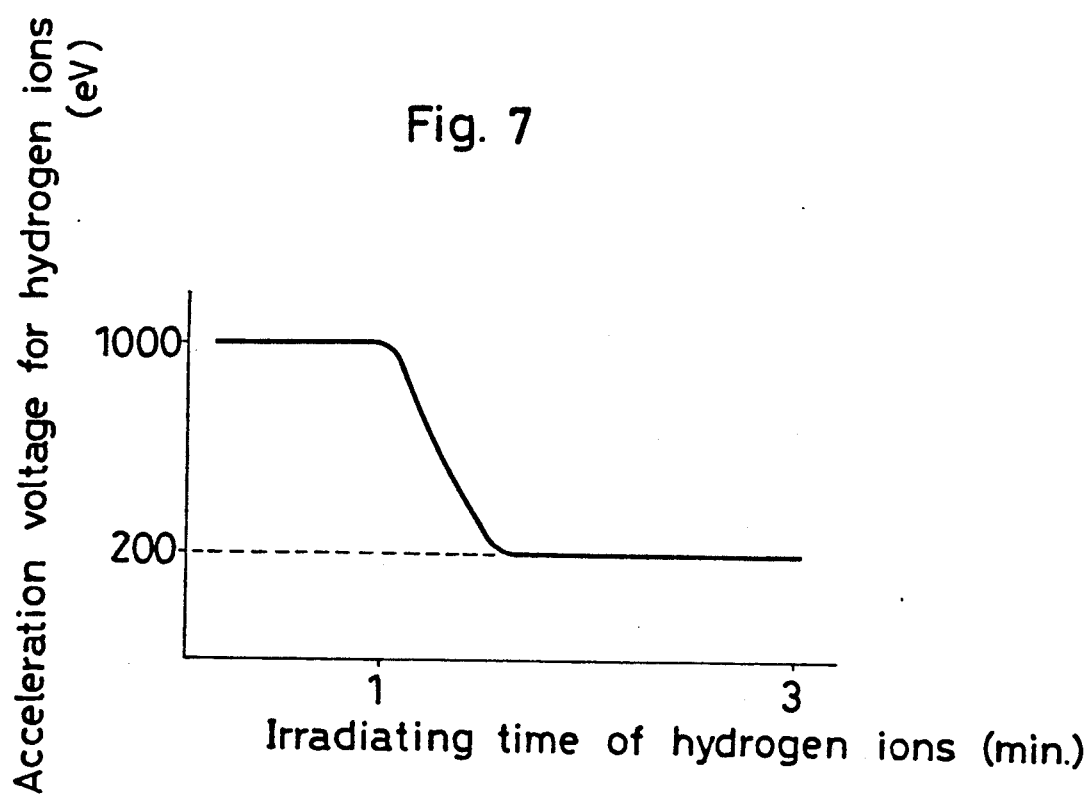
FIG. 7 shows the relationship between the acceleration voltage for and the irradiating time of the hydrogen ions.

Hydrogen ions as assisting ions are irradiated from the assisting ion gun 5 in the chamber 1. At the same time, carbon atoms are vapor-deposited from the vapor deposition source 4. As shown in FIGS. 6 and 7, the acceleration voltage for and the current density generated by the hydrogen ions are set 1keV and 10mA/cm², respectively. The edge base holder 2 is rotated in the direction of the arrow of FIG. 1 at a speed of 10 to 20 rpm in order to form the cores 9 in a uniform quality. By continuing the above operation for a minute, the surface of the mixture layer 6 locally gets high-temperature. The carbon atoms which have reached the high-temperature portions form the pseudo-diamond cores 9 without graphitizing (FIG. 3b).

Figure 3C:

Then, the current density and the acceleration voltage are drastically reduced to 2mA/cm² and 200eV, respectively, and are kept at these levels for approx. 2 minutes while the edge base holder 2 is rotated (FIG. 4). As a result, the a uniform film is formed on the cores 9 in a uniform quality (FIG. 3c). The film forming speed is 250Å/min., and the thickness of the film is approx. 0.33 μm.

The acceleration voltage and the current density are not limited to the above figures. Table 2 shows their optimum ranges for forming the cores 9 and the film 7.

TABLE 2

| Process | Acceleration voltage | Current density | Forming speed |
|---|---|---|---|
| Cores 9 | 1 to 10 keV | 0.2 mA/cm² or more | |
| Film 7 | 0.1 to 1 keV | 0.2 mA/cm² or more | approx. 300Å/min |

In this embodiment, the carbon atoms are vapor-deposited from the vapor deposition source 4 for forming the pseudo-diamond cores 9. However, if the carbon ions are irradiated in an excessive amount from the assisting ion gun 5 when forming the mixture layer 6, the vapor deposition of the carbon atoms for forming the cores 9 is not necessary.

Figure 8:
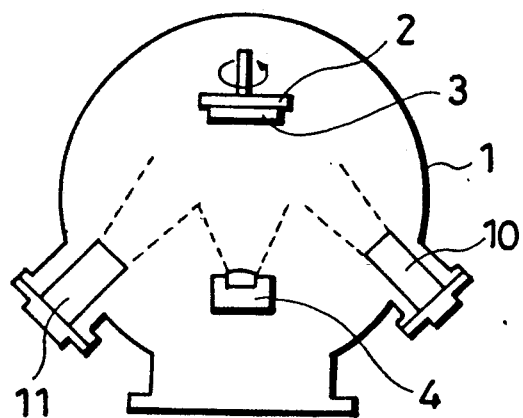
FIG. 8 is a schematic plan view of another apparatus for forming a pseudo-diamond film by a method according to this invention.

FIG. 8 shows another apparatus used for a method according to this invention. This apparatus is distinct from the one of FIG. 1 in that a high energy ion gun 10 and a low energy ion gun 11 are provided in the chamber 1.

In this apparatus, the pseudo-diamond film 7 is formed in the following way.

Figure 9A:
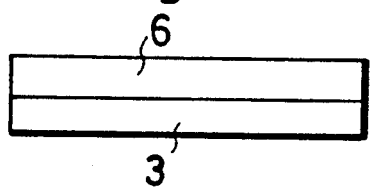
FIGS. 9a through 9d show steps of forming a pseudo-diamond film by the apparatus of FIG. 8.
Figure 9B:
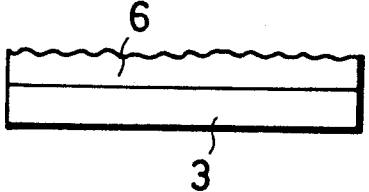
Figure 9C:
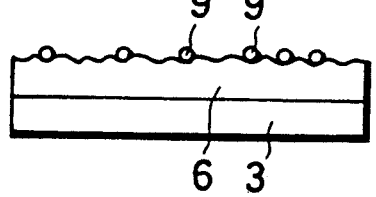
Figure 9D:
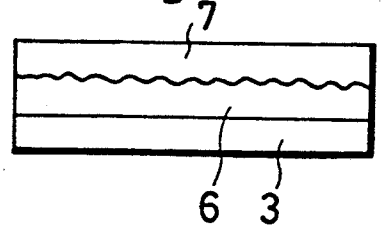

Carbon ions are irradiated from the high energy ion gun 10 to the surface of the edge base 3 with an acceleration voltage of 1 to 100keV, while the edge base holder 2 is rotated in the direction of the arrow of FIG. 1 at 10 to 20 rpm, thereby to form the mixture layer 6 having a thickness of, for example, 0.1 μm (FIG. 9a). Then, inert gas ions such as argon ions are sputtered onto the surface of the mixture layer 6 from the low energy ion gun 11 with an acceleration voltage of 1 to 10keV, thereby to roughen the surface (FIG. 9b). Thereafter, carbon ions are irradiated from the high energy ion gun 10 into the mixture layer 6 with an acceleration voltage of 10 to 20keV while the edge base holder 2 is rotated, thereby to form the pseudo-diamond cores 9 (FIG. 9c). Simultaneously, a mixture of hydrogen ions and inert gas ions such as argon ions is irradiated from the low energy ion gun 11 to the mixture layer 6 to prevent the cores 9 from graphitizing. After the cores 9 are formed, carbon atoms are vapor-deposited from the vapor deposition source 4 while the edge base holder 2 is rotated. Simultaneously, hydrogen ions and inert gas ions such as argon ions are irradiated from the low energy ion gun 11. Thus, the film 7 is formed on the cores 9 in a uniform quality (FIG. 9d).

Owing to the rough surface of the mixture layer 6, the adhering strength of the pseudo-diamond film 7 on the mixture later 6 is enhanced.

Although the present invention has been fully described by way of an embodiment with references to the accompanying drawings, it is to be noted that various changes and modifications will be apparent to those skilled in the art. Therefore, unless otherwise such changes and modifications depart from the scope of the present invention, they should be construed as being included therein.

What is claimed is:

1. A method of forming a pseudo-diamond film on a base body, the method comprising:
    a first step of irradiating carbon ions onto a surface of a base body from an assisting ion gun to form a mixture layer comprising base body material atoms and first carbon atoms;
    a second step of simultaneously vapor-depositing second carbon atoms from a vapor deposition source and irradiating hydrogen ions from the assisting ion gun onto the mixture layer to form pseudo-diamond cores on the mixture layer; and
    a third step of vapor-depositing third carbon atoms from the vapor deposition source and irradiating hydrogen ions from the assisting ion gun onto the pseudo-diamond cores to form a pseudo-diamond film on the pseudo-diamond cores.

2. A method of claim 1, wherein the base body is formed of a material selected from the group consisting of stainless steel, carbon steel, electrocasted nickel, copper, copper alloys, ceramics, aluminum, aluminum alloys, magnesium, magnesium alloys and reinforced plastics.

3. A method of claim 1, wherein the carbon ions are irradiated with an acceleration voltage which is high enough to allow the carbon ions to roughen the surface of the base body when the carbon ions bump into the surface but low enough to prevent the carbon ions from going deep inside the base body without roughening the surface.

4. A method of claim 1, wherein an acceleration voltage for and a current density generated by the hydrogen ions in the second step are high enough to form the pseudo-diamond cores on the surface of the base body without graphitizing the pseudo-diamond cores.

5. A method of claim 4, wherein an acceleration voltage for and a current density generated by the hydrogen ions in the third step are lower than those in the second step.

6. A method of forming a pseudo-diamond film on a base body, the method comprising:
    a first step of irradiating carbon ions in an excessive amount onto a surface of a base body from an assisting ion gun to form a mixture layer comprising base body material atoms and a portion of the carbon ions;
    a second step of irradiating hydrogen ions from the assisting ion gun onto the mixture layer to form pseudo-diamond cores comprising the remaining portion of the carbon ions on the mixture layer; and
    a third step of vapor-depositing carbon atoms from the vapor deposition source and irradiating hydrogen ions from the assisting ion gun onto the pseudo-diamond cores to form a pseudo-diamond film on the pseudo-diamond cores.

7. A method of claim 6, wherein the base body is formed of a material selected from the group consisting of stainless steel, carbon steel, electrocasted nickel, copper, copper alloys, ceramics, aluminum, aluminum alloys, magnesium, magnesium alloys and reinforced plastics.

8. A method of claim 6, wherein the carbon ions are irradiated with an acceleration voltage which is high enough to allow the carbon ions to roughen the surface of the base body when the carbon ions bump into the surface but low enough to prevent the carbon ions from going deep inside the base body without roughening the surface.

9. A method of claim 6, wherein an acceleration voltage for and a current density generated by the hydrogen ions in the second step are high enough to form the pseudo-diamond cores on the surface of the base body without graphitizing the pseudo-diamond cores.

10. A method of claim 6, wherein an acceleration voltage for and a current density generated by the hydrogen ions in the third step are lower than those in the second step.

11. A method of forming pseudo-diamond film on a base body, the method comprising:
a first step of irradiating carbon ions onto a surface of a base body to form a mixture layer comprising base body material atoms and carbon atoms;
a second step of roughening a surface of the mixture layer by sputtering;
a third step of irradiating hydrogen ions and either one of carbon atoms and carbon ions onto the mixture layer to form pseudo-diamond cores on the mixture layer; and
a fourth step of irradiating hydrogen ions and carbon atoms onto the pseudo-diamond cores to form a pseudo-diamond film on the pseudo-diamond cores.

12. A method of claim 11, wherein the base body is formed of a material selected from the group consisting of stainless steel, carbon steel, electrocasted nickel, copper, copper alloys, ceramics, aluminum, aluminum alloys, magnesium, magnesium alloys and reinforced plastics.

13. A method of claim 11, wherein an acceleration voltage for and a current density generated by the hydrogen ions in the third step are high enough to form the pseudo-diamond film on the surface of the base body without graphitizing the pseudo-diamond cores.

14. A method of claim 13, wherein an acceleration voltage for and a current density generated by the hydrogen ions in the fourth step are lower than those in the third step.

15. A method of forming a pseudo-diamond film using a vacuum deposition and ion irradiation apparatus including a rotatable base body holder, a vapor deposition source and an assisting ion gun in a chamber, the method comprising:
a first step of irradiating carbon ions onto a surface of a base body from an assisting ion gun to form a mixture layer comprising base body material atoms and first carbon atoms while rotating a base body holder;
a second step of simultaneously vapor-depositing second carbon atoms from a vapor deposition source and irradiating hydrogen ions from the assisting ion gun onto the mixture layer while rotating the base body holder to form pseudo-diamond cores on the mixture layer; and
a third step of vapor-depositing third carbon atoms from the vapor deposition source and irradiating hydrogen ions from the assisting ion gun onto the pseudo-diamond cores while rotating the base body holder to form a pseudo-diamond film on the pseudo-diamond cores.

16. A method of forming a pseudo-diamond film using a vacuum deposition and ion irradiation apparatus including a rotatable base body holder, a vapor deposition source, a first assisting ion gun for high energy acceleration and a second assisting ion gun for low energy acceleration in a chamber, the method comprising:
a first step of irradiating carbon ions onto a surface of a base body from a first assisting ion gun to form a mixture layer comprising base body material atoms and carbon atoms;
a second step of irradiating inert gas ions from a second assisting ion gun onto the mixture layer to roughen a surface of the mixture layer;
a third step of simultaneously irradiating carbon ions from the first assisting ion gun and irradiating a mixture of inert gas ions and hydrogen ions from the second assisting ion gun onto the mixture layer to form pseudo-diamond cores on the mixture layer; and
a fourth step of simultaneously driving a vapor deposition source to vapor-deposit carbon atoms and irradiating inert gas ions and hydrogen ions from the second assisting ion gun onto the pseudo-diamond cores to form a pseudo-diamond film on the pseudo-diamond cores.

* * * * *